(12) United States Patent
Rebeschi et al.

(10) Patent No.: US 8,890,841 B2
(45) Date of Patent: Nov. 18, 2014

(54) CAPACITIVE-BASED TOUCH APPARATUS AND METHOD THEREFOR, WITH REDUCED INTERFERENCE

(71) Applicant: 3M Innovative Properties Company, St. Paul, MN (US)

(72) Inventors: Thomas J. Rebeschi, Merrimack, NH (US); Craig A. Cordeiro, Westford, MA (US); William Farlow, Winston-Salem, NC (US)

(73) Assignee: 3M Innovative Properties Company, St. Paul, MN (US)

( * ) Notice: Subject to any disclaimer, the term of this patent is extended or adjusted under 35 U.S.C. 154(b) by 94 days.

(21) Appl. No.: 13/798,736

(22) Filed: Mar. 13, 2013

(65) Prior Publication Data

US 2014/0267129 A1  Sep. 18, 2014

(51) Int. Cl.
*G06F 3/045* (2006.01)
*G06F 3/044* (2006.01)

(52) U.S. Cl.
CPC ..................................... *G06F 3/044* (2013.01)
USPC ........................... 345/174; 345/173; 345/156

(58) Field of Classification Search
None
See application file for complete search history.

(56) References Cited

U.S. PATENT DOCUMENTS

| | | |
|---|---|---|
| 3,732,369 A | 5/1973 | Cotter |
| 4,071,691 A | 1/1978 | Pepper, Jr. |
| 4,175,239 A | 11/1979 | Sandler |
| 4,323,829 A | 4/1982 | Witney et al. |
| 4,581,483 A | 4/1986 | Ralston |
| 4,639,720 A | 1/1987 | Rympalski et al. |
| 4,686,332 A | 8/1987 | Greanias et al. |
| 5,006,952 A | 4/1991 | Thomas |
| 5,189,417 A | 2/1993 | Caldwell et al. |
| 5,305,017 A | 4/1994 | Gerpheide |
| 5,349,353 A | 9/1994 | Zrilic |
| 5,374,787 A | 12/1994 | Miller et al. |
| 5,488,204 A | 1/1996 | Mead et al. |

(Continued)

FOREIGN PATENT DOCUMENTS

| | | |
|---|---|---|
| EP | 0 178 157 A2 | 4/1986 |
| EP | 2 172 834 | 4/2010 |

(Continued)

OTHER PUBLICATIONS

PCT International Search Report for PCT/US2013/065896 mailed on Jan. 3, 2014, 4 pages.

(Continued)

*Primary Examiner* — Muhammad N Edun
(74) *Attorney, Agent, or Firm* — Robert S. Moshrefzadeh

(57) ABSTRACT

A touch-sensitive device that includes a touch surface circuit that facilitates a change in a coupling capacitance in response to a capacitance-altering touches occurring at the touch surface. The device includes a sense circuit that provides a signal, in response thereto, having transient portions for characterizing positive-going transitions towards an upper signal level and negative-going transitions towards a lower signal level. An amplification circuit is then used for amplifying and processing the signals, in response to the time-varying input parameters. The amplification circuit adjusts the gain for the transient portions relative to gain for portions of the response signals between the transient portions, and thereby suppresses RF interference, such as in the form of signal odd and/or even harmonics, to provide a noise filtered output for determining positions of capacitance-altering touches on the touch surface.

20 Claims, 8 Drawing Sheets

(56) References Cited

U.S. PATENT DOCUMENTS

| | | | |
|---|---|---|---|
| 5,526,294 A | 6/1996 | Ono et al. |
| 5,572,205 A | 11/1996 | Caldwell et al. |
| 5,730,165 A | 3/1998 | Philipp |
| 5,790,106 A | 8/1998 | Hirano et al. |
| 5,790,107 A | 8/1998 | Kasser |
| 5,825,352 A | 10/1998 | Bisset et al. |
| 5,861,583 A | 1/1999 | Schediwy et al. |
| 5,867,111 A | 2/1999 | Caldwell et al. |
| 5,920,309 A | 7/1999 | Bisset et al. |
| 6,075,520 A | 6/2000 | Inoue et al. |
| 6,239,389 B1 | 5/2001 | Allen et al. |
| 6,452,514 B1 | 9/2002 | Philipp |
| 6,466,036 B1 | 10/2002 | Philipp |
| 6,535,200 B2 | 3/2003 | Philipp |
| 6,717,574 B2 | 4/2004 | Yeh |
| 6,879,930 B2 | 4/2005 | Sinclair |
| 6,885,365 B1 | 4/2005 | Kang |
| 6,888,536 B2 | 5/2005 | Westerman |
| 6,970,160 B2 | 11/2005 | Mulligan et al. |
| 7,129,714 B2 | 10/2006 | Baxter |
| 7,148,704 B2 | 12/2006 | Philipp |
| 7,265,746 B2 | 9/2007 | Knowles |
| 7,274,353 B2 | 9/2007 | Chiu et al. |
| 7,292,229 B2 | 11/2007 | Morag et al. |
| 7,453,444 B2 | 11/2008 | Geaghan |
| 7,830,157 B2 | 11/2010 | Geaghan |
| 8,077,161 B2 | 12/2011 | Kinoshita |
| 2001/0006369 A1 | 7/2001 | Ely |
| 2003/0076306 A1 | 4/2003 | Zadesky et al. |
| 2003/0122432 A1 | 7/2003 | Caldwell |
| 2004/0004488 A1 | 1/2004 | Baxter |
| 2004/0119701 A1 | 6/2004 | Mulligan et al. |
| 2004/0178997 A1 | 9/2004 | Gillespie et al. |
| 2006/0012581 A1 | 1/2006 | Haim et al. |
| 2006/0022959 A1 | 2/2006 | Geaghan |
| 2006/0092142 A1 | 5/2006 | Gillespie et al. |
| 2006/0097991 A1 | 5/2006 | Hotelling et al. |
| 2006/0232567 A1 | 10/2006 | Westerman et al. |
| 2007/0074913 A1 | 4/2007 | Geaghan et al. |
| 2007/0074915 A1 | 4/2007 | Chung et al. |
| 2007/0084645 A1 | 4/2007 | Chung et al. |
| 2007/0247172 A1 | 10/2007 | Li |
| 2007/0257890 A1 | 11/2007 | Hotelling et al. |
| 2007/0268272 A1 | 11/2007 | Perski et al. |
| 2007/0285365 A1 | 12/2007 | Lee |
| 2008/0004505 A1 | 1/2008 | Kapit et al. |
| 2008/0006453 A1 | 1/2008 | Hotelling |
| 2008/0078590 A1 | 4/2008 | Sequine |
| 2008/0087477 A1 | 4/2008 | Cho et al. |
| 2008/0106520 A1 | 5/2008 | Free et al. |
| 2008/0142281 A1 | 6/2008 | Geaghan |
| 2008/0158167 A1 | 7/2008 | Hotelling et al. |
| 2008/0158169 A1 | 7/2008 | O'Connor et al. |
| 2008/0158175 A1 | 7/2008 | Hotelling et al. |
| 2008/0162996 A1 | 7/2008 | Krah et al. |
| 2008/0162997 A1 | 7/2008 | Vu et al. |
| 2008/0165134 A1 | 7/2008 | Krah |
| 2008/0251299 A1 | 10/2008 | Liao et al. |
| 2008/0309625 A1 | 12/2008 | Krah et al. |
| 2009/0009483 A1 | 1/2009 | Hotelling et al. |
| 2009/0025987 A1 | 1/2009 | Perski et al. |
| 2009/0066670 A1 | 3/2009 | Hotelling et al. |
| 2009/0096757 A1 | 4/2009 | Hotelling et al. |
| 2009/0096758 A1 | 4/2009 | Hotelling et al. |
| 2009/0194344 A1 | 8/2009 | Harley et al. |
| 2009/0219258 A1 | 9/2009 | Geaghan et al. |
| 2009/0244033 A1 | 10/2009 | Westerman et al. |
| 2009/0284495 A1 | 11/2009 | Geaghan et al. |
| 2010/0033437 A1 | 2/2010 | Matsubara |
| 2010/0073323 A1 | 3/2010 | Geaghan |
| 2010/0149110 A1 | 6/2010 | Gray |
| 2010/0188345 A1 | 7/2010 | Keskin et al. |
| 2010/0300773 A1 | 12/2010 | Cordeiro et al. |
| 2011/0007021 A1 | 1/2011 | Bernstein et al. |
| 2011/0084857 A1 | 4/2011 | Marino et al. |
| 2011/0102360 A1* | 5/2011 | Chen et al. ............... 345/173 |
| 2011/0115717 A1 | 5/2011 | Hable et al. |
| 2011/0157080 A1 | 6/2011 | Ciesla et al. |
| 2011/0163992 A1 | 7/2011 | Cordeiro et al. |
| 2011/0291986 A1 | 12/2011 | Rebeschi et al. |
| 2012/0062497 A1 | 3/2012 | Rebeschi et al. |
| 2012/0162133 A1* | 6/2012 | Chen et al. ............... 345/174 |
| 2012/0313890 A1 | 12/2012 | Mohindra |

FOREIGN PATENT DOCUMENTS

| | | |
|---|---|---|
| FR | 2 774 497 A1 | 8/1999 |
| GB | 2 072 389 A | 9/1981 |
| JP | 02-288122 A | 11/1990 |
| JP | 11-305932 A | 11/1999 |
| JP | 2000-076014 A | 3/2000 |
| JP | 2007-052639 A | 3/2007 |
| JP | 2007-334690 A | 12/2007 |
| JP | 2009-110418 A | 5/2009 |
| JP | 2009-192306 A | 8/2009 |
| KR | 10-2003-0453971 A | 10/2004 |
| WO | WO 2004/019258 A2 | 3/2004 |
| WO | WO 2004/040606 A2 | 5/2004 |
| WO | WO 2006/104745 A2 | 10/2006 |
| WO | WO 2007/017848 A2 | 2/2007 |
| WO | WO 2008/085720 A1 | 7/2008 |
| WO | WO 2010/138485 A1 | 12/2010 |

OTHER PUBLICATIONS

Anonymous, "Variable-gain amplifier", Wikipedia, Nov. 1, 2012, 5 pages.

Analog Devices AD7142/AD7142-1, Rev. PrD, "Programmable Capicatance-to-Digital Converter with Environmental Compensation", 2005 Analog Devices, Inc., pp. 1-64.

Bao et al.; "DOA Estimation Under Unknown Mutual Coupling and Multipath", IEEE Transactions on Aerospace and Electronic Systems IEEE USA, vol. 41, No. 2, Apr. 2005, pp. 565-573.

Geaghan et al., "Low Cost Mutual Capacitance Measuring Circuits and Methods", Presented at SID Conference, Austin, TX, Jun. 3, 2009, 4 pages.

"Operational_Transconductance_Amplifier", Creative Commons Attribution-ShareALike [On-line], [ updated on the internet Apr. 15, 2010], URL<http://en.wikipedia.org/wiki/Operational_transconductance_amplifier>.

QMatrix Data Sheet, Mutual Capacitance QT60486_104, 2003, Quantum Research Group, Ltd., pp. 1-30.

SID Conference Presentation, "Low Cost Mutual Capacitance Measuring Circuit", 3M Touch Systems, San Antonio, Texas, 9 pages, © 2009.

* cited by examiner

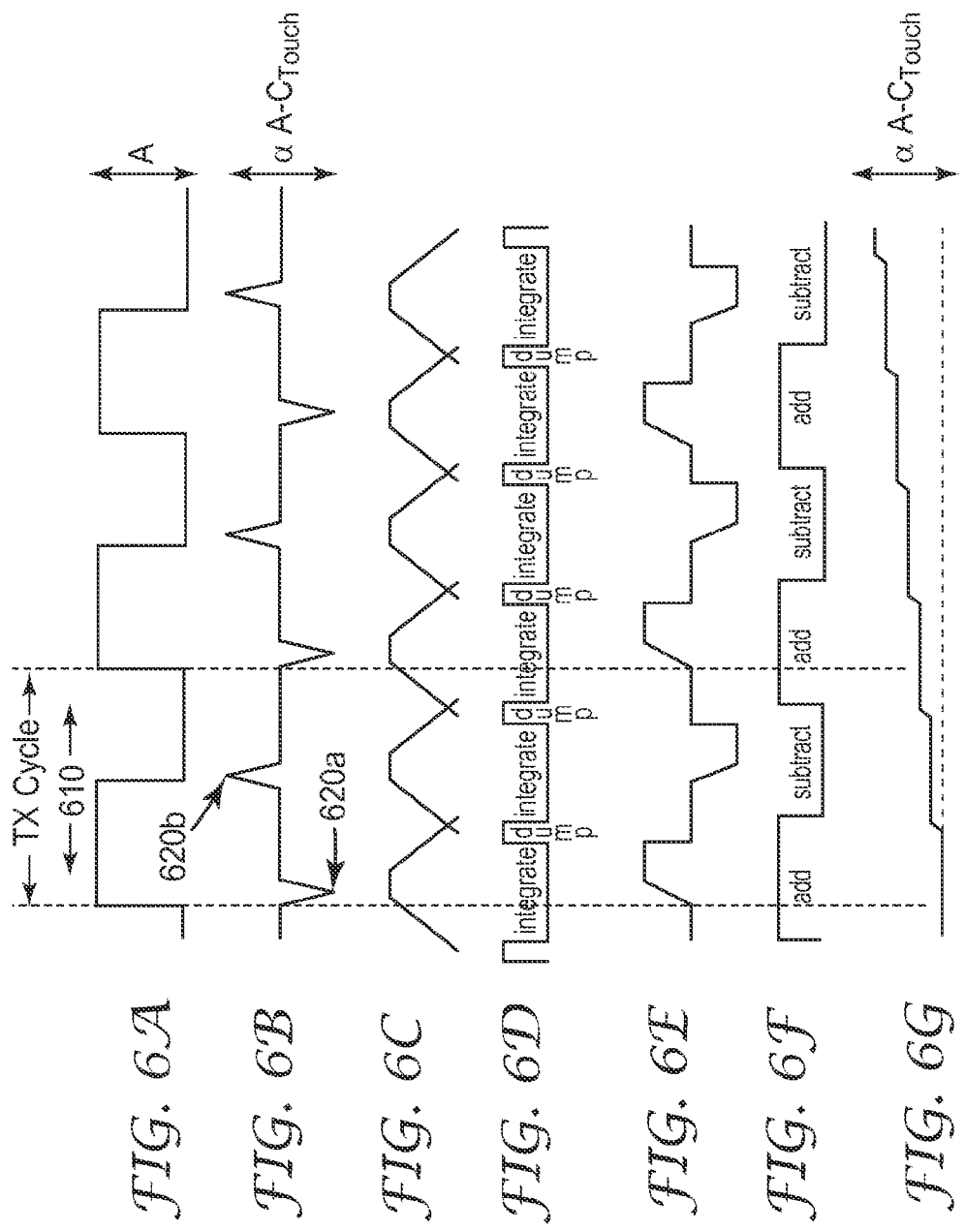

CAPACITIVE-BASED TOUCH APPARATUS AND METHOD THEREFOR, WITH REDUCED INTERFERENCE

FIELD OF THE INVENTION

This disclosure relates generally to touch-sensitive devices, particularly those that rely on a capacitive coupling between a user's finger or other touch implement and the touch device, with particular application to such devices that are capable of detecting multiple touches applied to different portions of the touch device at the same time.

BACKGROUND

Touch sensitive devices can be implemented to allow a user to interface with electronic systems and displays conveniently, for example, by providing a display input that is typically prompted by a visual in the display for user-friendly interaction and engagement. In some instances, the display input complements other input tools such as mechanical buttons, keypads and keyboards. In other instances, the display input acts as an independent tool for reducing or eliminating the need for mechanical buttons, keypads, keyboards and pointing devices. For example, a user can carry out a complicated sequence of instructions by simply touching an on-display touch screen at a location identified by an icon or by touching a displayed icon in conjunction with another user input.

There are several types of technologies for implementing a touch sensitive device including, for example, resistive, infrared, capacitive, surface acoustic wave, electromagnetic, near field imaging, etc., and combinations of these technologies. Touch sensitive devices that use capacitive touch sensing devices have been found to work well in a number of applications. In many touch sensitive devices, the input is sensed when a conductive object in the sensor is capacitively coupled to a conductive touch implement such as a user's finger. Generally, whenever two electrically conductive members come into proximity with one another without actually touching, a capacitance is formed therebetween. In the case of a capacitive touch sensitive device, as an object such as a finger approaches the touch sensing surface, a tiny capacitance forms between the object and the sensing points in close proximity to the object. By detecting changes in capacitance at each of the sensing points and noting the position of the sensing points, the sensing circuit can recognize multiple objects and determine the characteristics of the object as it is moved across the touch surface.

Different techniques have been used to measure touch based on such capacitive changes. One technique measures change in capacitance-to-ground, whereby the status of an electrode is understood based on the capacitive condition of a signal that is applied to the electrode before a touch would alter the signal. A touch in proximity to the electrode causes signal current to flow from the electrode, through an object such as a finger or touch stylus, to electrical ground. By detecting the change in capacitance at the electrode and also at various other points on the touch screen, the sensing circuit can note the position of the points and thereby recognize the location on the screen where the touch occurred. Also, depending on the complexity of the sensing circuit and related processing, various characteristics of the touch can be assessed for other purposes such as determining whether the touch is one of multiple touches, and whether the touch is moving and/or satisfies expected characteristics for certain types of user inputs.

Another known technique monitors touch-related capacitive changes by applying a signal to a signal-drive electrode, which is capacitively coupled to a signal-receive electrode by an electric field. As these terms connote, with the signal-receive electrode returning an expected signal from the signal-drive electrode, an expected signal (capacitive charge) coupling between the two electrodes can be used to indicate the touch-related status of a location associated with the two electrodes. Upon or in response to an actual or perceived touch at/near the location, the status of signal coupling changes, and this change is reflected by a reduction in the capacitive coupling.

For these and other related capacitive-touch sensing techniques, various methodologies have been used to measure the mutual capacitance between electrodes. Depending on the applications, these methodologies might specify different types and speeds of signals through which the signal-drive electrode would provide the expected signals to the signal-drive electrode, from which a change in capacitive charge is sensed. With the growing trend in higher-speed electronics, many such applications are requiring that relatively higher-frequency signals be used for driving the signal-drive electrodes. Unfortunately, RF (radio-frequency) interference can ensue from both the higher-speed electronics and such signals generated therefrom. This RF interference can degrade and, in some applications, can undermine the effectiveness of the sensing circuits and related processing for the associated touch display. Adverse effects can include speed of detection, accuracy and power consumption.

The above issues are examples of those that have presented challenges to the effective designs of touch-sensitive displays and related methods for locating and assessing the touches.

BRIEF SUMMARY

Aspects of the present disclosure are directed to overcoming the above-mentioned challenges and others related to the effective designs of touch-sensitive displays and related methods for locating and assessing the touches for the types of touch displays as discussed above and elsewhere. The present disclosure is exemplified in a number of implementations and applications, some of which are summarized below.

According to one embodiment, the present disclosure is directed to a touch-sensitive apparatus that includes a touch surface circuit that facilitates a change in a coupling capacitance in response to a capacitance-altering touch occurring at the touch surface. The apparatus includes a sense circuit that provides a signal, in response thereto, having transient portions for characterizing positive-going transitions towards an upper signal level and negative-going transitions towards a lower signal level. An amplification circuit is then used for amplifying and processing the signals, in response to the time-varying input parameters. The amplification circuit adjusts the gain for the transient portions relative to gain for portions of the response signals between the transient portions, and thereby suppresses RF interference, such as in the form of signal harmonics, to provide a noise filtered output for determining positions of capacitance-altering touches on the touch surface.

According to another embodiment, the present disclosure is directed to a touch-sensitive apparatus that includes a touch surface circuit, a sense circuit, and an amplification circuit. The touch surface circuit includes a touch surface and a plurality of electrodes, wherein each of the plurality of electrodes is associated with a coupling capacitance that changes in response to a capacitance-altering touch at the touch surface. The sense circuit is configured to generate response signals for the plurality of electrodes, and each of the response signals has amplitude responsive to the coupling capacitance at the touch surface and includes a differentiated signal representation with transient portions characterizing positive-going transitions towards an upper signal level and negative-going transitions towards a lower signal level. The amplification circuit provides time-varying input parameters for characterizing the transient portions, with the amplification circuit including a variable-gain amplifier for processing the differentiated signal representation of the response signals to provide variable gain thereto, in response to the time-varying parameters. As with the previously-discussed embodiment, the gain is adjusted for the transient portions relative to gain for portions of the response signals between the transient portions, and therein suppressing harmonics in the response signals for providing a noise filtered output that characterizes the associated coupling capacitance for determining positions of touches on the touch surface.

In more specific embodiments, variations to the above embodiments are implemented. For example, the provided variable gain can increase gain for the transient portions and decrease gain for portions of the response signals between the transient portions. As another variation, the amplifier can be implemented with multiple stages for processing the response signals in sequence. As a variable-gain amplifier, one amplification stage can be implemented to suppress odd harmonics (e.g., including the $3^{rd}$ and $5^{th}$ harmonics) in the response signals, to filter noise interference in the response signals as part of the processing by the variable-gain amplifier, and another amplification stage can be implemented to suppress harmonics (e.g., even harmonics) in the response signals, also for filtering RF-noise interference.

Other aspects of the disclosure are directed to an amplification circuit, not necessarily limited to capacitance-based touch-input response signals, for amplifying and processing impedance-alterable signals that are intentionally-modulated. For example, one or more drive electrodes in a circuit grid (e.g., memory array) can be intentionally-modulated to present an expected impedance (e.g., capacitance/inductance) to receive electrodes that, in turn, deliver (impedance-alterable) response signals to a sense circuit. The circuit grid is configured such that the impedance at location(s) along the receive electrode(s) is altered by an asynchronous (external) signal or condition. The amplification circuit is implemented, similar to the circuit described above, as a RF-noise filtering variable-gain amplifier with one amplification stage that is implemented to suppress odd harmonics (e.g., including the $3^{rd}$ and $5^{th}$ harmonics) in the response signals, and another amplification stage that is implemented to suppress harmonics (e.g., even harmonics) in the response signals. By removing/suppressing such noise and specifically these harmonics, the output of the amplification circuit can be monitored (e.g., amplitude, slope, duration, likelihood of valid occurrence, and/or proximity to valid (external) signal or condition) for assessing the (external) signals or conditions.

Yet other aspects of the disclosure are directed to more specific embodiments involving the variable-gain amplifier and other aspects such as a measurement circuit for performing measurements on characterizations of the associated coupling capacitance and determining therefrom positions of touches on the touch surface. The measurement circuit, for example, can be configured and arranged to measure amplitudes of each of the response signals for each of the nodes for determining the positions of multiple temporally-overlapping touches (assuming they are present on the touch surface). In more specific embodiments, the measurement unit includes a multiplexer and an analog-to-digital converter (ADC), the latter of which presents a digital version of the signals to the multiplexer for selectively passing response signals respectively associated with the receive electrodes.

More specific aspects involving the variable-gain amplifier include, for example, including an integration circuit as part of the variable-gain amplifier for using time-varying parameters to provide an integration-and-dump filter operation at the transient portions with decimation to a multiple of a clock rate used for sampling the response signals. The variable-gain amplifier can also be configured to include a first integration stage and a second noise-suppression stage. The first stage integrates the differentiated signal representation of the response signals using the time-varying parameters to facilitate decimation at the transient portions for creation of nulls for harmonics of the RF signal, and the second stage, in response to and functionally cooperating with the first stage, is configured to suppress the harmonics.

Methodologies and further aspects of these embodiments and other embodiments are discussed in more detail below.

The above summary is not intended to describe each illustrated embodiment or every implementation of the present disclosure.

BRIEF DESCRIPTION OF DRAWINGS

The disclosure may be more completely understood in consideration of the following detailed description of various embodiments of the disclosure in connection with the accompanying drawings in which, according to the instant disclosure:

FIGS. 6A through 6G form parts of another time-based diagram showing signal timing of the last stage of integration of FIGS. 2B and 3A.

Figure 1A:
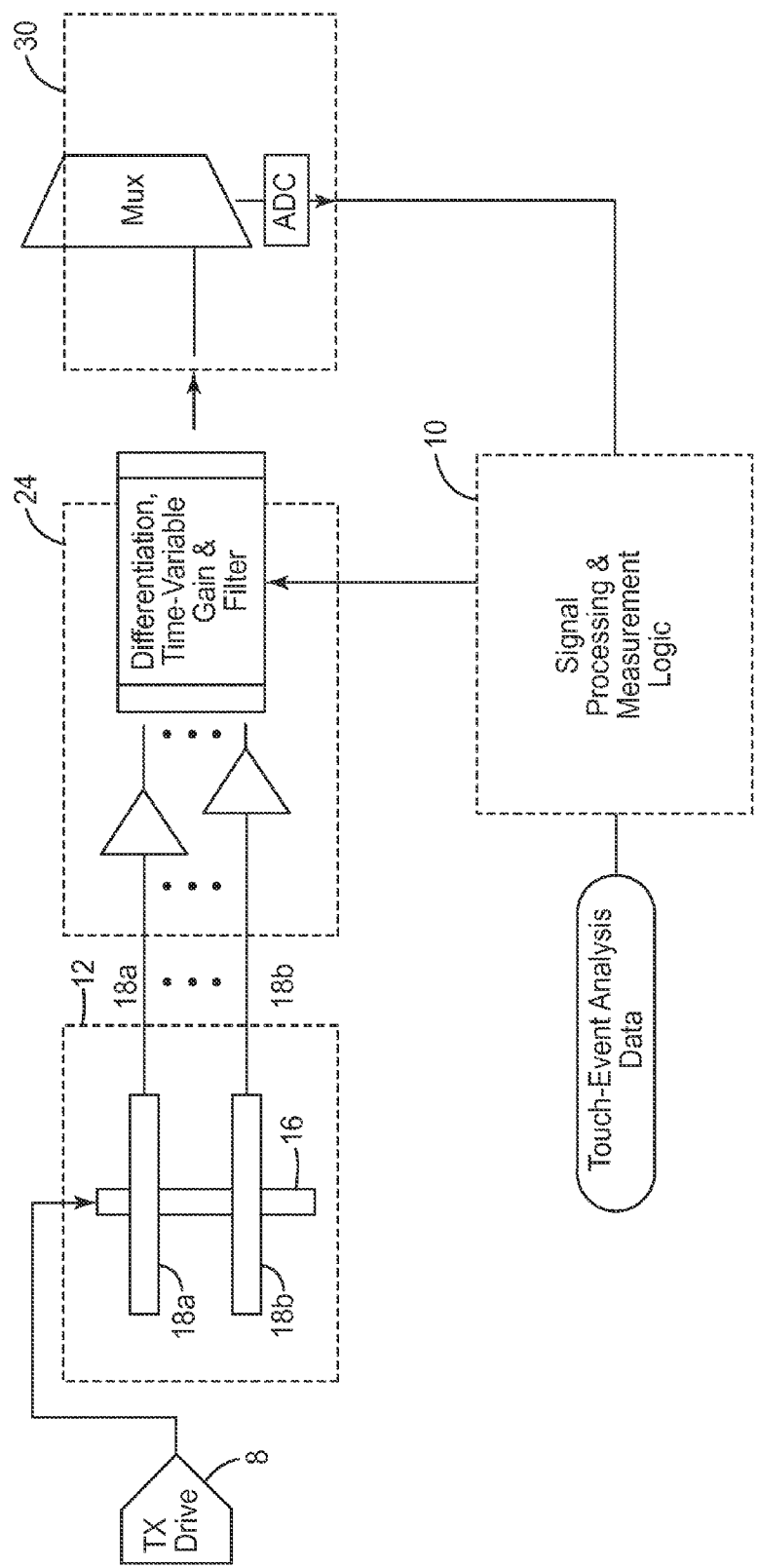
FIG. 1A is a schematic view of a touch device.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

DETAILED DESCRIPTION

Aspects of the present disclosure are believed to be applicable to a variety of different types of touch-sensitive display systems, devices and methods including those involving circuitry that is susceptible to creating RF interference on response signals used to indicate where a touch event may have occurred at the touch display device. While the present disclosure is not necessarily limited to such circuitry and applications, various aspects of the disclosure may be appreciated through a discussion of various examples using this context.

According to certain example embodiments, the present disclosure is directed to touch-sensitive apparatuses of the type that includes a touch surface circuit configured to facilitate a change in a coupling capacitance in response to a capacitance-altering touch. The apparatus includes a sense circuit that provides a responsive signal having transient portions for characterizing positive-going transitions towards an upper signal level and negative-going transitions towards a lower signal level. An amplification circuit is then used for amplifying and processing the signals, in response to the time-varying input parameters. The amplification circuit adjusts the gain for the transient portions relative to gain for portions of the response signals between the transient portions, and thereby suppresses RF interference, such as in the form of odd and/or even harmonics, to provide a noise filtered output for determining positions of capacitance-altering touches on the touch surface.

FIG. 1A illustrates a specific example of the above-noted type of touch device that includes, also in accordance with the present disclosure, a touch surface circuit 12, a sense circuit 24, and digital conversion circuitry 30. The touch surface circuit 12, the sense circuit 24, and the digital conversion circuitry 30 are cooperatively designed, as with the above-described embodiment, to suppress RF interference and thereby provide a noise filtered output for determining positions of capacitance-altering touches on the touch surface. For many applications, included as part of the touch device are drive circuitry 8 and data processing logic (e.g., microcomputer circuit) 10. The drive circuitry 8, which can be external or internal to the touch device, is configured for providing the drive electrode 16 in the touch surface circuit 12 with a bias drive signal that can be used for providing a reference through which capacitance-altering touch events can be sensed at a capacitive node, and later processed by the data processing logic 10. For many applications, the drive circuitry 8 alone and/or with other high-frequency coupling circuitry, generates a high frequency signals from which RF-noise interference is of concern. The RF-noise interference may be present in the form of harmonics frequencies developed directly from the drive signal produced by the drive circuitry 8. This drive circuitry 8 is often used for driving other circuits and/or producing other high frequency signals, such as used with the above-noted microcomputer and signal-sampling circuits involved in analog-to-digital conversion circuits. The touch panel 12 can be susceptible to RF noise sources related to the display electronics and other external RF noise generators.

Consistent with the above discussion, this RF-noise interference is lessened, if not completely removed, by processing the change in a coupling capacitance via a response signal, that is returned via receive electrodes 18a and 18b (FIG. 1A) using the sense circuit 24. The sense circuit 24 provides a responsive signal, referred to as a response signal, having transient portions for characterizing positive-going transitions towards an upper signal level and negative-going transitions towards a lower signal level (as discussed in below with, for example, with FIGS. 3B and 6B).

Within the sense circuit 24, gain and filtering circuitry is then used for amplifying and processing the signals, in response to time-varying input parameters that estimate these transient portions. The sense circuit 24 thereby adjusts the gain for the transient portions relative to gain for portions of the response signals between the transient portions, and thereby suppresses RF interference. To appreciate how these transient portions are created to represent the response signal, FIG. 1B is presented below with more details regarding the development of the capacitance-altering signals that are developed in connection with the drive and receive electrodes of the touch panel.

Accordingly, using a touch device along with relevant controller circuitry, a sense circuit and an amplification circuit can be used for processing response signals, as developed via the return paths from receive electrodes of a touch panel, for detecting changes in capacitance at associated locations or nodes of the touch panel. It will be appreciated that such a touch panel might have an application-specific layout for the drive electrode(s) and receive electrode(s) such as through an organized arrangement of a plurality of receive electrodes relative to one or more drive electrodes, the latter of which can be arranged with a plurality of receive electrodes to provide a matrix where the application would require the provision of many specific touch-panel nodes at electrode crossing points of the matrix. As an example of another application, a drive electrode might be provided in the form of an ITO or nano-mesh relative to one or more receive electrodes, each of which would provide a differentiable response signal based location and/or signal characteristic (e.g., amplitude, shape, modulation type, and/or phase).

Figure 1B:
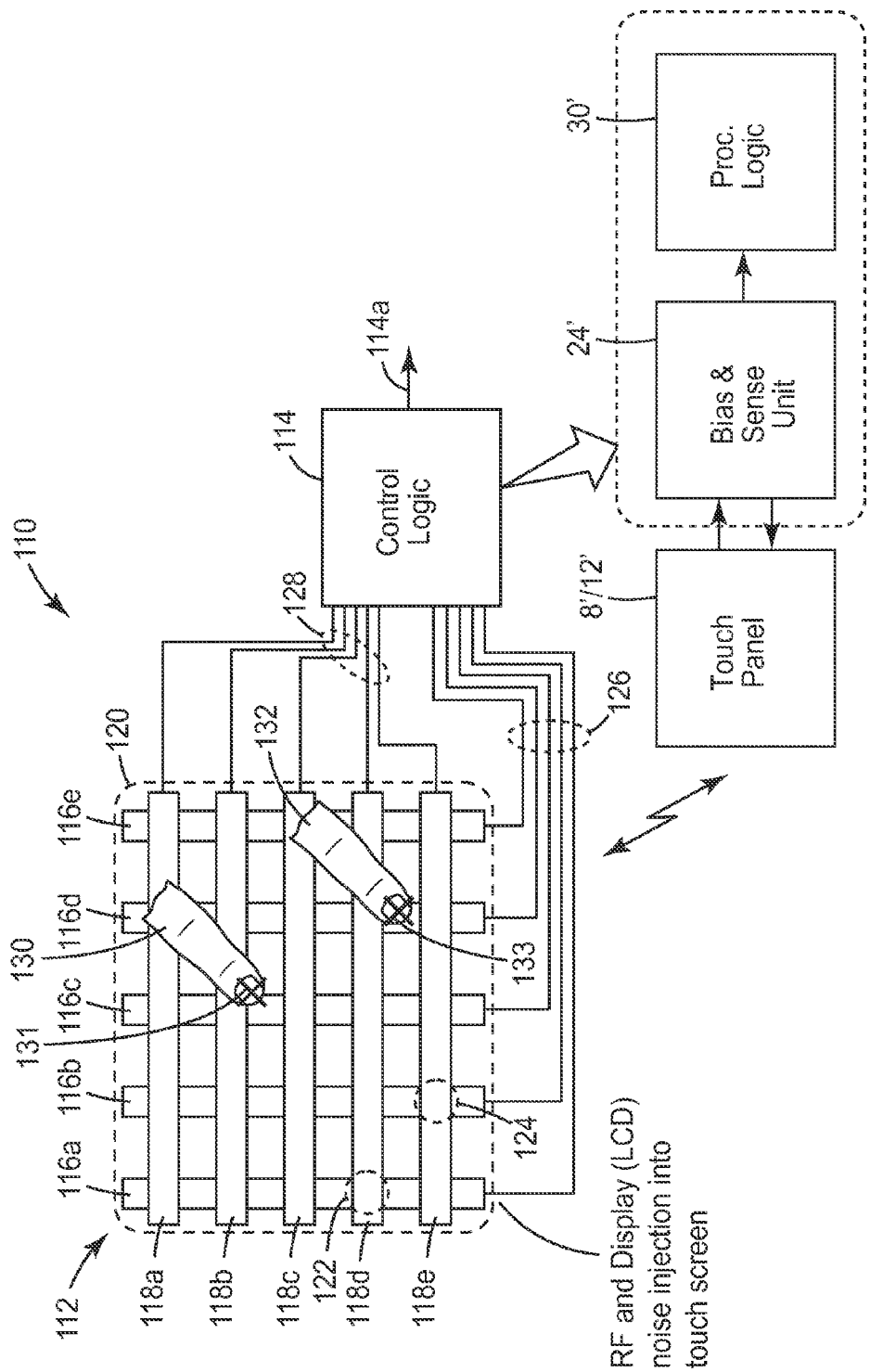
FIG. 1B is a schematic view of another touch device.

In FIG. 1B, an exemplary touch device 110 is shown. The device 110 includes a touch panel 112 connected to electronic circuitry, which for simplicity is grouped together into a single schematic box labeled 114 and referred to collectively as a controller which is implemented as (control) logic circuitry such as including analog-signal interface circuitry, a microcomputer, processor and/or programmable logic array. Thus, the controller 114 is shown as encompassing aspects of bias circuitry and touch surface circuitry 8'/12' (relative to touch panel 112 of FIG. 1A), and sense circuit 24' (relative to sense circuit 24 of FIG. 1A) and a processor logic unit 30' (relative to digital conversion circuitry 30 of FIG. 1A).

The touch panel 112 is shown as having a 5×5 matrix of column electrodes 116a-e and row electrodes 118a-e, but other numbers of electrodes and other matrix sizes can also be used. For many applications, the touch panel 112 is exemplified as being transparent or semi-transparent to permit the user to view an object through the touch panel. Such applications include, for example, objects for the pixilated display of a computer, hand-held device, mobile phone, or other peripheral device. The boundary 120 represents the viewing area of the touch panel 112 and also preferably the viewing area of such a display, if used. The electrodes 116a-e, 118a-e are spatially distributed, from a plan view perspective, over the boundary 120. For ease of illustration the electrodes are shown to be wide and obtrusive, but in practice they may be relatively narrow and inconspicuous to the user. Further, they may be designed to have variable widths, e.g., an increased width in the form of a diamond- or other-shaped pad in the vicinity of the nodes of the matrix in order to increase the inter-electrode fringe field and thereby increase the effect of a touch on the electrode-to-electrode capacitive coupling. In exemplary embodiments, the electrodes may be composed of indium tin oxide (ITO) or other suitable electrically conductive materials. From a depth perspective, the column electrodes may lie in a different plane than the row electrodes (from the perspective of FIG. 1B, the column electrodes 116a-e lie underneath the row electrodes 118a-e) such that no significant ohmic contact is made between column and row electrodes, and so that the only significant electrical coupling between a given column electrode and a given row electrode is capacitive coupling. The matrix of electrodes typically lies beneath a cover glass, plastic film, or the like, so that the electrodes are protected from direct physical contact with a user's finger or other touch-related implement. An exposed surface of such a cover glass, film, or the like may be referred to as a touch surface. Additionally, in display-type applications, a back shield (as an option) may be placed between the display and the touch panel 112. Such a back shield typically consists of a conductive ITO coating on a glass or film, and can be grounded or driven with a waveform that reduces signal coupling into touch panel 112 from external electrical interference sources. Other approaches to back shielding are known in the art. In general, a back shield reduces noise sensed by touch panel 112, which in some embodiments may provide improved touch sensitivity (e.g., ability to sense a lighter touch) and faster response time. Back shields are sometimes used in conjunction with other noise reduction approaches, including spacing apart touch panel 112 and a display, as noise strength from LCD displays, for example, rapidly decreases over distance. In addition to these techniques, other approaches to dealing with noise problems are discussed in reference to various embodiments, below.

The capacitive coupling between a given row and column electrode is primarily a function of the geometry of the electrodes in the region where the electrodes are closest together. Such regions correspond to the "nodes" of the electrode matrix, some of which are labeled in FIG. 1B. For example, capacitive coupling between column electrode 116a and row electrode 118d occurs primarily at node 122, and capacitive coupling between column electrode 116b and row electrode 118e occurs primarily at node 124. The 5×5 matrix of FIG. 1B has such nodes, anyone of which can be addressed by controller 114 via appropriate selection of one of the control lines 126, which individually couple the respective column electrodes 116a-e to the controller, and appropriate selection of one of the control lines 128, which individually couple the respective row electrodes 118a-e to the controller.

When a finger 130 of a user or other touch implement comes into contact or near-contact with the touch surface of the device 110, as shown at touch location 131, the finger capacitively couples to the electrode matrix. The finger draws charge from the matrix, particularly from those electrodes lying closest to the touch location, and in doing so it changes the coupling capacitance between the electrodes corresponding to the nearest node(s). For example, the touch at touch location 131 lies nearest the node corresponding to electrodes 116c/118b. As described further below, this change in coupling capacitance can be detected by controller 114 and interpreted as a touch at or near the 116a/118b node. Preferably, the controller is configured to rapidly detect the change in capacitance, if any, of all of the nodes of the matrix, and is capable of analyzing the magnitudes of capacitance changes for neighboring nodes so as to accurately determine a touch location lying between nodes by interpolation. Furthermore, the controller 114 advantageously is designed to detect multiple distinct touches applied to different portions of the touch device at the same time, or at overlapping times. Thus, for example, if another finger touches the touch surface of the device 110 at touch location 133 simultaneously with the touch of finger 130, or if the respective touches at least temporally overlap, the controller is preferably capable of detecting the positions 131, 133 of both such touches and providing such locations on a touch output 114a. The number of distinct simultaneous or temporally overlapping touches capable of being detected by controller 114 is preferably not limited to 2, e.g., it may be 3, 4, or greater than 60, depending on the size of the electrode matrix.

As discussed further below, the controller 114 can employ a variety of circuit modules and components that enable it to rapidly determine the coupling capacitance at some or all of the nodes of the electrode matrix. For example, the controller preferably includes at least one signal generator or drive unit. The drive unit delivers a drive signal to one set of electrodes, referred to as drive electrodes. In the embodiment of FIG. 1B, the column electrodes 116a-e may be used as drive electrodes, or the row electrodes 118a-e may be so used. The drive signal is preferably delivered to one drive electrode at a time, e.g., in a scanned sequence from a first to a last drive electrode. As each such electrode is driven, the controller monitors the other set of electrodes, referred to as receive electrodes. The controller 114 may include one or more sense units coupled to all of the receive electrodes. For each drive signal that is delivered to each drive electrode, the sense unites) generate response signals for the plurality of receive electrodes. Preferably, the sense units are designed such that each response signal comprises a differentiated representation of the drive signal. For example, if the drive signal is represented by a function f(t) (e.g., representing a voltage as a function of time), then the response signal may be equal to, or provide an approximation of, a function g(t), where g(t)=df(t)/dt. In other words, g(t) is the derivative with respect to time of the drive signal f(t). Depending on the design details of the circuitry used in the controller 114, the response signal may include signals such as: (1) g(t) alone; or (2) g(t) with a constant offset (g(t)+a); or (3) g(t) with a multiplicative scaling factor (b*g(t)), the scaling factor capable of being positive or negative, and capable of having a magnitude greater than 1, or less than 1 but greater than 0; or (4) combinations thereof. In any case, the amplitude of the response signal is advantageously related to the coupling capacitance between the drive electrode being driven and the particular receive electrode being monitored. The amplitude of g(t) is also proportional to the amplitude of the original function f(t), and if appropriate for the application the amplitude of g(t) can be determined for a given node using only a single pulse of a drive signal.

The controller may also include circuitry to identify and isolate the amplitude of the response signal. Exemplary circuit devices for this purpose may include one or more peak detectors, sample/hold buffer, time variable integrator and/or second stage integrator low-pass filter, the selection of which may depend on the nature of the drive signal and the corresponding response signal. The controller may also include one or more analog-to-digital converters (ADCs) to convert the analog amplitude to a digital format. One or more multiplexers may also be used to avoid unnecessary duplication of circuit elements. Of course, the controller also preferably includes one or more memory devices in which to store the measured amplitudes and associated parameters, and a microprocessor to perform the necessary calculations and control functions.

By measuring the amplitude of the response signal for each of the nodes in the electrode matrix, the controller can generate a matrix of measured values related to the coupling capacitances for each of the nodes of the electrode matrix. These measured values can be compared to a similar matrix of previously obtained reference values in order to determine which nodes, if any, have experienced a change in coupling capacitance due to the presence of a touch.

From the side, a touch panel for use in a touch device can include a front (transparent) layer, a first electrode layer with a first set of electrodes arranged in parallel, an insulating layer, a second electrode layer with a second set of electrodes arranged in parallel and preferably orthogonal to the first set of electrodes, and a rear layer. The exposed front surface layer may be part of or attached to the touch surface of the touch panel.

Figure 2A:
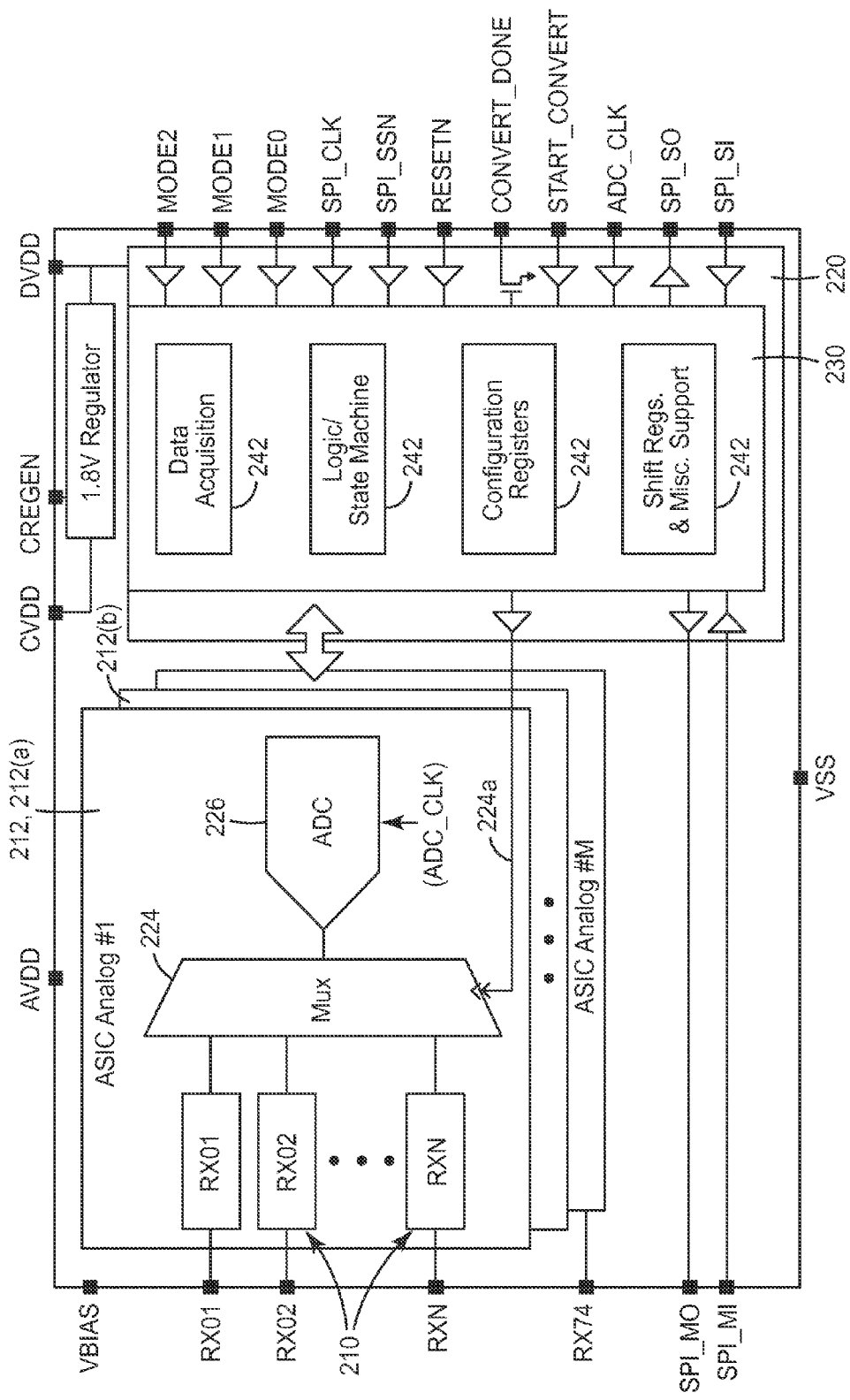
FIG. 2A is a schematic view of yet another touch device, showing circuit modules configured for specific embodiments in which response signals are processed along parallel signal paths for a measurement module (or circuit)

FIG. 2A is a schematic view of another touch device, consistent with many of the above-discussed aspects, showing a front-end circuit module 212 (or optionally operating as one of multiple front-end modules 212(a), 212(b), etc. in parallel) and a back-end circuit module 220 configured for certain analog and digital processing, respectively, of response signals provided from electrodes of a touch panel (not shown). In specific embodiments, including those represented by FIG. 2A, the back-end circuit module 220 is implemented in concert with other circuitry (as with the controller 114 of FIG. 1B) for providing various timing and control signals such as those shown along the right side of the back-end circuit module 220.

As depicted via the (optionally-replicated blocks on) the left side of FIG. 2A, response-signal circuits 210 operate on the respective response signals provided via associated input ports RX01, RX02, etc. As will be discussed further in connection with FIG. 3A, these response-signal circuits 210 are implemented to operate on and provide accurate touch monitoring (of the associated coupling capacitance at the touch surface) for the touch panel nodes associated with the corresponding (signal-feeding) receive electrode (FIG. 1B). While these response-signal circuits 210 can be implemented to operate and provide such touch monitoring concurrently, in the illustrated example, the output port of only one of these response-signal circuits 210 is selected through a multiplexer ("Mux") 224 for such processing.

The multiplexer 224, in response to an input-selection/control signal 224a, provides a selected channel of the analog-processed response signals, as defined by the associated response signal path, to an analog-to-digital converter (ADC) 226. The multiplexer 224 can be controlled to step through the RXN channels until all the electrodes are converted by the ADC. The ADC 226 presents a digital version of the analog-processed response signals to a measurement circuit 230 (in the back-end circuit module 220) that is configured for responding to the response signals by performing measurements on characterizations of the previously-discussed associated coupling capacitance and by determining from these characterizations positions of touches on the touch surface. As would be typical for an over-sampling ADC, the ADC 226 is responsive to an ADC_clock signal provided via input port 232 and operating, for example, at about 8 MHz or a multiple thereof.

In specific embodiments, one or both of the front-end and back-end circuit modules 212 and 220 are implemented in application-specific-integrated-circuit (ASIC) chips as depicted the boundary lines defining modules 212 and 220. For example, the front-end circuit module 212 can be implemented using one ASIC chip with each of one or more (replicated) internal circuits configured for processing one or more of the response signal paths from the receive electrode(s) and with the back-end circuit module implemented using another ASIC chip configured with measurement circuitry for performing measurements on the response signals.

In each such specific embodiment, both modules 212 and 220 use data, timing and control signals to effect proper processing of the response signals by the response-signal circuits 210. For example, to the left of the front-end module 212, these control signals include a voltage bias signal ($V_{Bias}$) as used for biasing nodes of circuits used for integrating the response signals within the response-signal circuits 210. The front-end module 212 is also responsive to control/configuration signals provided by the back-end circuit module 220, including control/configuration signals used to set time-variable parameters for controlling the gain, timing and generally processing of the response signals by the response-signal circuits 210. A configuration register 240, within the measurement circuit 230, can be used to fix these time-variable parameters and other control signals as may be needed for a given touch pad (or other type device feeding the receive electrodes). The measurement circuit 230 also includes related support circuits for acquiring and storing these processed response signals (data acquisition logic) and circuitry illustrated in the form of state machine circuitry 244 and miscellaneous register/support circuitry 246 as would be appreciated for an ASIC-based implementation.

As those shown along the right side of the back-end circuit module 220, other timing and control signals are provided to assist in the timing of the processing by the response-signal circuits 210 and of the ADC 226. These signals include Mode control, serial peripheral interface compatible (SPI) control lines and data receive and transmit and a control for when the receive logic starts converting the row data (along the receive electrode(s)) and when the data conversion is completed. The signals are shown on the right hand side of the figure.

Figure 2B:
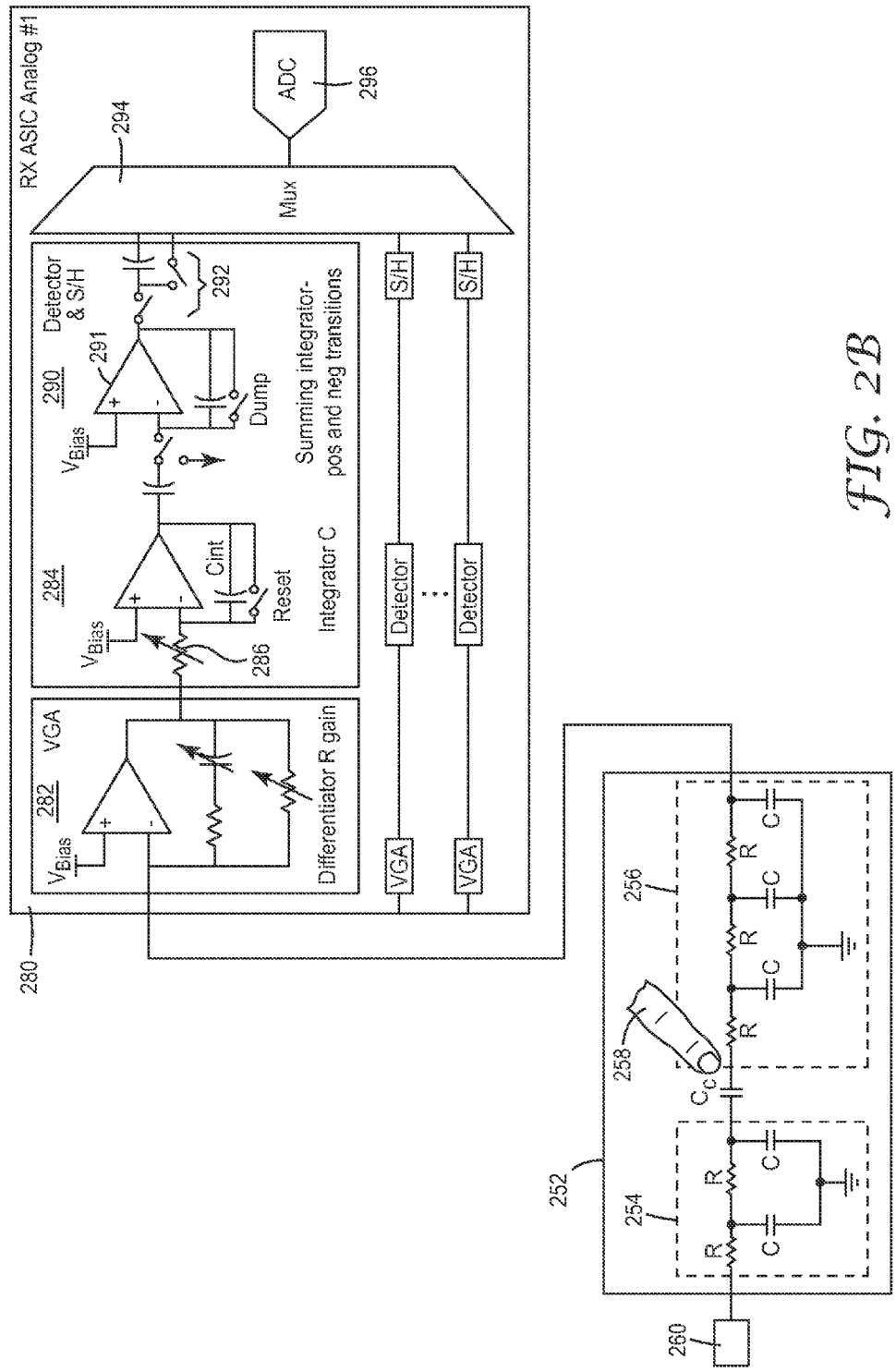
FIG. 2B is a schematic view of a portion of the touch device of FIG. 2A, showing exemplary modules for specific embodiments involving circuits for processing the response signals along one of the parallel signal paths.

FIG. 2B illustrates an example circuit with an exploded view corresponding to one of the previously-illustrated touch panels (12 of FIG. 1A or 112 of FIG. 1B) and the front-end circuit module of FIG. 2A. As contemplated with one such touch-panel implementation, the touch panel may include a 40-rows-by-64-columns matrix device having a 19-inch diagonal rectangular viewing area with a 16:10 aspect ratio. In this case, the electrodes may have a uniform spacing of about 0.25 inches and, in other specific embodiments, can be 0.2 inches or less. Due to the size of this embodiment, the electrodes may have significant stray impedances associated therewith, e.g., a resistance of 40K ohms for the row electrodes and 64K ohms for the column electrodes. Taking into account the human factors involved with such touch response processing, the response time to measure the coupling capacitance at all 2,560 nodes of the matrix (40×64=2560) may, if desired, be made to be relatively fast, e.g., less than 20 or even less than 10 milliseconds. If the row electrodes are used as the drive electrodes and the column electrodes used as the receive electrodes, and if all of the column electrodes are sampled simultaneously, then the 40 rows of electrodes have, for example, 20 msec (or 10 msec) to be scanned sequentially, for a time budget of 0.5 msec (or 0.25 msec) per row electrode (drive electrode).

Referring again to the specific illustration of FIG. 2A, the drive electrode 254 and receive electrode 256 of FIG. 2A, which are depicted by their electrical characteristics (in the form of lumped circuit element models) rather than by their physical characteristics, are representative of electrodes that may be found in a touch device having a matrix smaller than 40×64, but this is not to be considered limiting. In this representative embodiment of FIG. 2A, the series resistances R shown in the lumped circuit models may each have values of 10K ohms, and the stray capacitances C shown in the lumped circuit models may each have values of 20 picofarads (pf), but of course these values are not to be taken as limiting in any way. In this representative embodiment the coupling capacitance $C_c$ is nominally 2 pf, and the presence of a touch by a user's finger 258 at the node between electrodes 254, 256 causes the coupling capacitance $C_c$ to drop by about 25%, to a value of about 1.5 pf. Again, these values are not to be taken as limiting.

In accordance with the controller described earlier, such a touch device uses specific circuitry to interrogate the panel 252 to determine the coupling capacitance $C_c$ at each of the nodes of the panel 252. In this regard, the controller can determine the coupling capacitance by determining the value of a parameter that is indicative of, or responsive to, the coupling capacitance, e.g., the amplitude of a response signal as mentioned above and described further below. To accomplish this task, the touch device preferably includes: a low impedance drive unit (within controller 114 of FIG. 1B or signal generator 260 of FIG. 2B) coupled to the drive electrode 254; a sense unit 280 coupled to the receive electrode 256; and an analog-to-digital converter (ADC) unit 226 that converts an amplitude of the response signal generated by the sense unit 280 into a digital format. The sense unit 280 includes a differentiating variable-gain amplification (VGA) circuit 282 which performs a differentiation on the drive signal supplied by the drive unit. The VGA circuit 282 includes a variable-gain resistor and can have a variable-gain capacitance for, respectively, setting the circuit gain and optimizing stability for the gain.

Depending on the nature of the drive signal supplied by the drive unit 260 (and hence also on the nature of the response signal generated by the sense unit 280), the touch device of FIG. 2A may also include: a peak detection circuit (not shown) which could also serve as a sample/hold buffer; and an associated reset circuit 326b operable to reset the peak detector. In most practical applications the touch device will also include a multiplexer between the signal generator 260 (FIG. 2B) and the touch panel 252, to permit the capability of addressing any one of a plurality of drive electrodes at a given time. In this way, a change in mutual capacitance occurs when the object (e.g., finger or conductive stylus) alters the mutual coupling between row and column electrodes, which are thereby sequentially scanned in response to multiplexed drive signals. Similarly, on the receive side, another multiplexer (224 of FIG. 2A) allows a single ADC unit to rapidly sample the amplitudes associated with multiple receive electrodes, thus avoiding the expense of requiring one ADC unit for each receive electrode. Element 212b shows several layers of similar circuits with multiple ADCs. This implementation has 5 such channels.

The above-discussed VGA circuit 282 of FIG. 2B provides an output, in the form of a differentiated signal that characterizes the response signal, to another amplification circuit shown in FIG. 2B using two stages. The first stage, depicted as an integrating amplifier 284, is configured and arranged to perform an integration on the differentiated signal representation of the response signals using the time-varying parameters to facilitate decimation at the transient portions for creation of nulls for odd harmonics of the RF signal. The integrating amplifier 284 amplifies, by integrating, the pulsed portions of the drive signals as characterized on their return (from the receive electrodes) in the response signals. A variable resistance circuit 286, at the front end input of the integrating amplifier 284, is controlled to provide a time-varying change in gain to the response signals to achieve this operation on the pulsed portions (corresponding to the drive signals). The amplification-integration operation is reset, using another control signal (not shown), which is synchronized with the timing of the corresponding drive signal to effect the proper repetition of the operation for each pulsed portion. This amplification serves to amplify the operative aspects of the response signals, while suppressing undesired noise, including the odd harmonics of the drive signal, carried by the response signals.

The integrating amplifier 284 provides an output that is capacitively coupled to the second stage 290 for further processing of the response signal. This further processing provides an integration, using operational amplifier 291, for combining the transient portions at the positive-going transitions and the negative-going transitions, for increasing signal strength and concurrently providing an effective common-mode suppression of noise, including even harmonics, by summing the positive and negative aspects (including the amplified transition portions) of the single-line differentiated response signal as processed from the output of the integrating amplifier 284. This integration by the second stage is thus repeated, by way of an integration-and-dump operation, to effect proper repetition of the operation for each pulsed portion as with the previously-discussed stage and with a similarly-controlled control signal (not shown) for integration reset.

The second stage 290 provides its output, through another capacitively-coupled path 292, to a multiplexer and ADC as previously described in connection with FIG. 2A. The capacitively-coupled path includes sample and hold circuitry (conceptually depicted by capacitance and switches) for preserving the analog characterization of each portion of the response signal, as processed by the second stage 290, which can be further processed through multiplexer 294 and ADC 296 for assessment by a controller or measurement circuit.

More specifically, the operational amplifier 291 is used to perform a summing operation to cause the positive and negative edge transitions to be combined for maximum signal strength and, ideally, the noise between these positive and negative edge transitions is canceled due to the opposite-phase summing as in common-mode suppression. As a specific implementation, this can be achieved by selecting, in response to clock phasing for the positive and negative edge transitions, either an inverting or non-inverting integrator (or integration operation) to subtract the negative edges from the positive edges. This summing integration thereby sums the positive and negative direction signals to provide a pseudo-differential signal that increases the signal amplitude 2× and reduces the common mode noise that is coupled into the sensor. A $V_{Bias}$ signal at one input to the operational amplifier 291, is set at a level to allow optimization of the output level along the capacitively-coupled path 292 for a sample-and-hold effect (S/H) for subsequent analog-digital conversion by the ADC 296. Using time-varying coefficients at front end of the first stage 284, the combination of the signal differentiation and the first stage of integration helps to reduce gain variation from the on-chip gain (provided by the resistive paths) and the slope of the TX (or drive) signal. Variation remains from on-chip integration capacitance ($C_{INT}$) and touch screen capacitance. The level of the drive signal helps to compensate for screen variation across different rows, where the capacitance ($C_{INT}$ of FIG. 2B) in the integration feedback path adjusts for variation across different receivers. The signal levels involved in this combined differentiation and integration can be estimated mathematically as follows:

$$I_{screen} = C_C \cdot dV_{TX}/dt$$

$$V_{DIFF} = I_{screen} \cdot R_{DIFF} = C_C \cdot R_{DIFF} \cdot dV_{TX}/dt$$

$$I_{INT} = V_{DIFF}/R_{INT}$$

$$= C_C \cdot (R_{DIFF}/R_{INT}) \cdot dV_{TX}/dt$$

$$dV_{INT} = (I_{INT}/C_{INT}) \cdot dt$$

$$dV_{INT} = dV_{TX} \cdot (C_C/C_{INT}) \cdot (R_{DIFF}/R_{INT}),$$

where the current sensed at the touch device is $I_{screen}$, the differentiated voltage signal is $V_{DIFF}$, and its integrated version is expressed as $dV_{INT}$.

Accordingly, the variable-gain amplification circuitry of FIG. 2B includes an integration circuit that uses the time-varying parameters to provide an integration-and-dump signal-filtering operation at the transient portions. This signal-filtering operation can be aided by decimation to a multiple of a clock rate used for sampling the response signals. The previously-discussed measurement circuit can then respond to the response signals, as processed via the variable-gain amplifier of FIG. 2B, by performing measurements on characterizations of the associated coupling capacitance and determining therefrom positions of touches on the touch surface. Using the signal-process teachings in Patent Document No. WO2010/138485 (PCT/US2010/036030) as a reference, this processing provides increased signal to noise with the increased TX drive levels and improved CRFI (conducted radio frequency immunity) and LCD (liquid crystal display) noise rejection with the improved RX receiver circuits. The overall power level and costs are also significantly reduced. For further/background information regarding the operation of a touch device in a similar environment, reference may be made to this above-noted Patent Document which is herein incorporated by reference for such teachings and those regarding front-end signal processing and timing and back-end (controller-based/measurement) response-signal processing.

In connection with specific experimental implementations of circuitry consistent with the circuitry of FIG. 2B, such integration on the differentiated signal representation of the response signals can be used advantageously to create nulls in the frequency response. Using such implementations, RF-signal noise especially the $3^{rd}$ and $5^{th}$ harmonics in the frequency response (per the integration of the differentiated signal representation) is filtered by way of such nulls. As described above, this RF-signal noise filtering can include both such odd harmonics as well as the interleaving even harmonics.

Figure 3A:
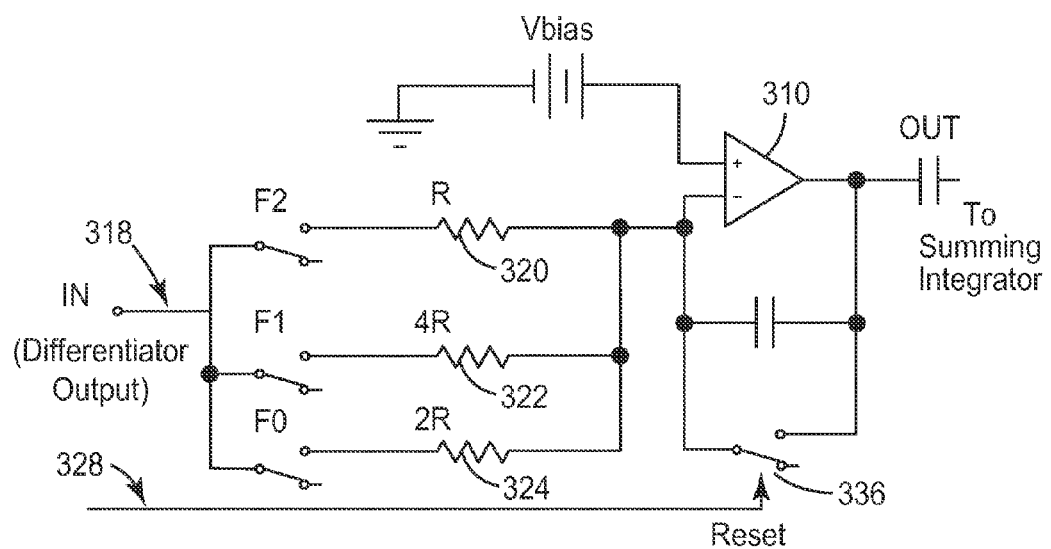
FIG. 3A is a schematic view of a portion of the circuit shown in FIG. 2B.
Figure 3B:
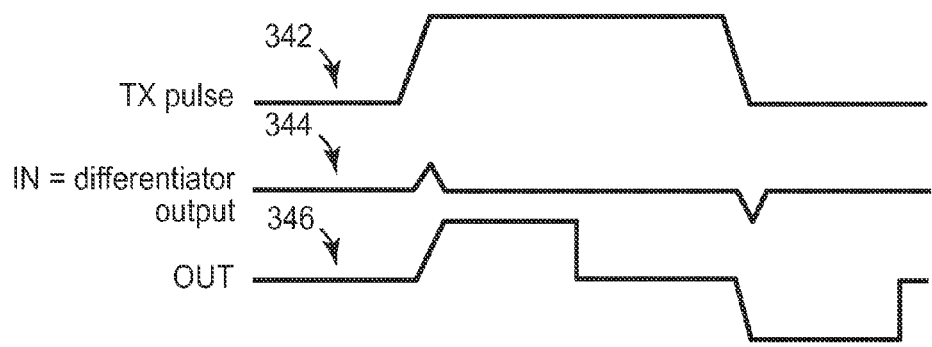
FIG. 3B is a timing diagram showing the processing of signals by circuitry shown in FIG. 2B and FIG. 3A.
Figure 3C:
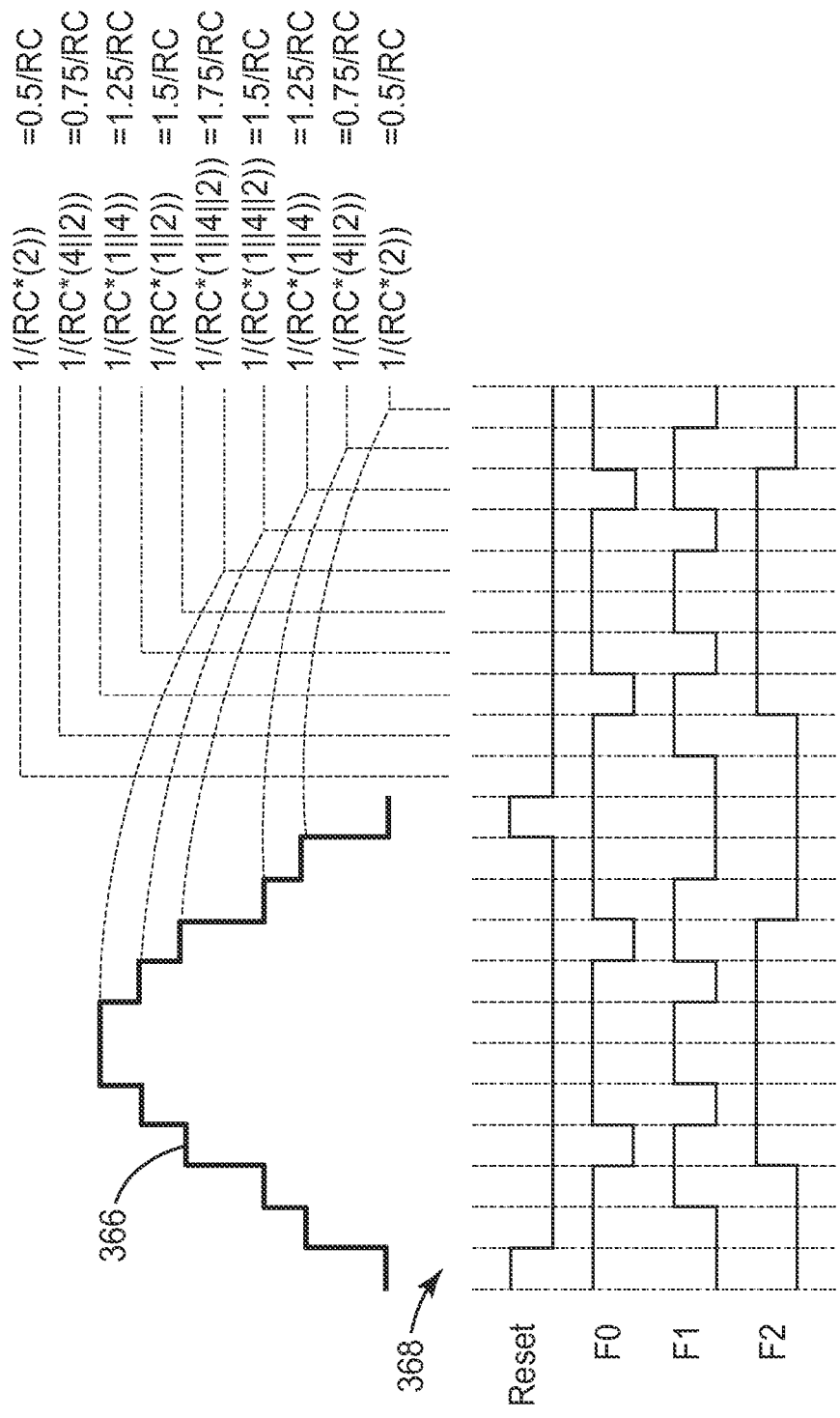
FIG. 3C is another timing diagram showing the processing of signals and circuitry shown in FIG. 2B and FIG. 3A.

FIGS. 3A, 3B and 3C provide further detail for an understanding of aspects pertaining to the first stage in FIG. 2B. These aspects are the variable resistance and timing involved with the integrating amplifier 284. For the specific example embodiment illustrated in FIG. 3A, the operational amplifier 310 includes a positive input port connected to voltage reference ($V_{Bias}$ as with the commonly-named signal in FIGS. 2A and 2b) and a negative input port arranged for receiving, as an input signal (at "IN" port 318), the output of the previous circuitry which is the (differentiation) circuit 282 of FIG. 2B. Corresponding to the variable resistance circuit 286 of FIG. 2B, the variable resistance shown in FIG. 3A is provided by three resistors arranged for connection in parallel paths: a first resistor (R) 320, a second resistor (4R) 322, and a third resistor (2R) 324. In each of the corresponding parallel paths are respective switches, one or more of which are selectively closed using control signals via path 328 (provided the controller and synchronized with the drive signal to effect the proper repetition of the operation for each pulsed portion). These selectable switches are denoted 330, 332 and 334, for respectively connecting one or more of resistors 320, 322 and 324, between the IN port 318 and the negative input port of the operative amplifier 310. A similarly-controlled switch 336 is also controlled, in a manner synchronized with the drive signal, to effect the reset timing coincident with the repetition provided for each pulsed portion.

FIG. 3B is a timing diagram showing three signals 342, 344 and 346 relevant to the circuitry of FIG. 3A. The first signal 342 is the TX pulse, with one pulse of the pulsed signal driven onto the drive electrodes (e.g., as used in FIGS. 1A and 1B). The pulsed frequency of the TX pulse can vary; however, for many applications including those described in connection with FIGS. 1A and 1B, an 100 KHZ pulse is adequate, and with an 8 Mhz clock used to define the pulse timing for the TX pulse. The second signal 344, as presented at the IN port 318, is the single-line differentiated signal with an upwardly-directed impulse spike aligned with the illustrated positive slope of the TX pulse and with an downwardly-directed impulse spike aligned with the negative slope of the TX pulse. These are the differentiated transition portions, corresponding to the TX pulse edges, for which the sense circuitry monitors the response signals. As shown at the bottom of FIG. 3B, the third signal 346 corresponds to the output of the circuitry in FIG. 3A, which output is used to drive the second (summing-integrator) stage as shown at 290 of FIG. 2B.

FIG. 3C is another timing diagram showing how the selectable switches 330, 332 and 334 and the reset switch 336, can be controlled to effect a desired or optimal time-variable gain for circuitry shown in FIG. 3A. As illustrated in FIGS. 3A and 3C, each of the switches 330, 332, 334 and 336 is closed (conducting state) when the corresponding control signal for the switch is in a logic high state as shown in the timing diagram of FIG. 3C. For example, with each of the switches 330, 332 and 334 being in the closed state, the gain provided by the operational amplifier 310 of FIG. 3A is maximum, as illustrated by the center of the stair-step graph 366 at the top of FIG. 3C. Just after being reset at time point 368, the gain provided by the operational amplifier 310 of FIG. 3A is set by the switch 330 being in the closed state, and the switches 332 and 334 being in the open (nonconducting) state. This follows because the switches 330, 332 and 334 are used to define the RC time constant for the integration operation of the operational amplifier 310, where the R of the RC is the resistance provided by the parallel arrangement of resistors 320, 322 and 324, and the C of the RC is the capacitance provided in the negative feedback loop of the operational amplifier 310. Thus, table at the right of FIG. 3C shows the time constant inverse associated with exemplary time points of the timing diagram.

Figure 4:
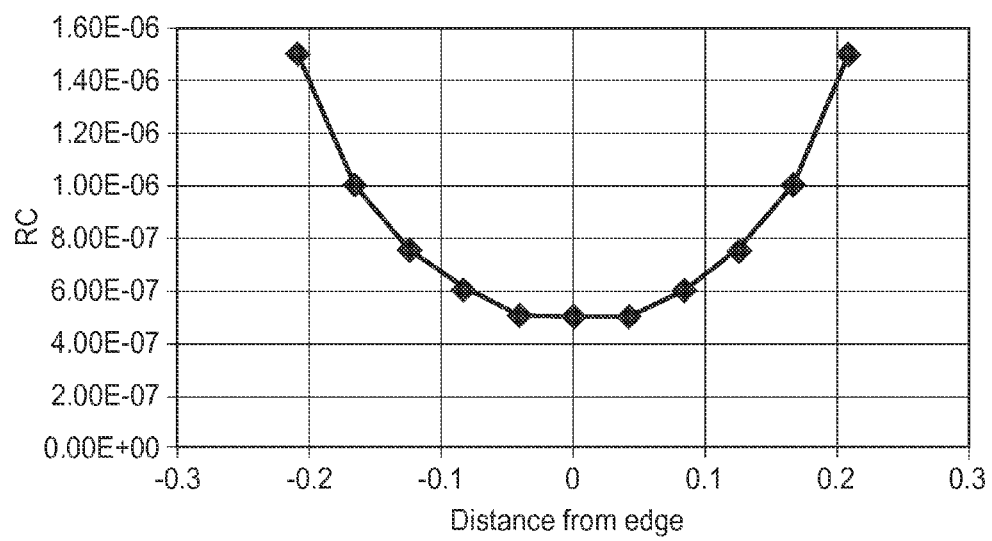
FIG. 4 is a time-based graph showing gain of amplification circuitry in FIG. 3A in terms of a variable-time constant.
Figure 5:
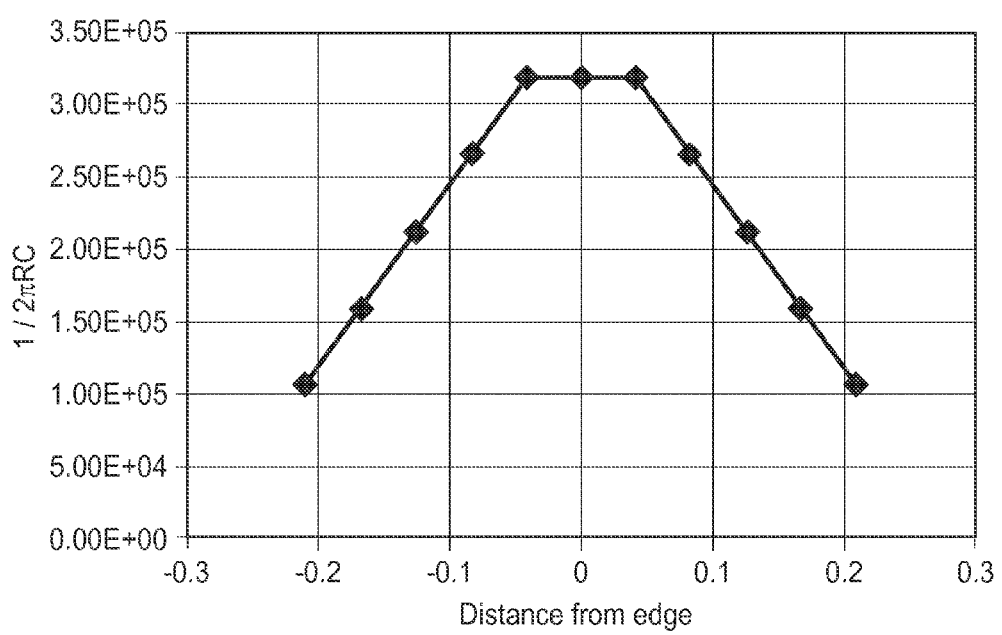
FIG. 5 is another time-based graph that shows gain of amplification circuitry in FIG. 3A in terms of frequency and as a function of the above-referenced variable-time parameter.

FIGS. 4 and 5 are time-based graphs for showing gain of the operational amplifier 310 of FIG. 3A in terms of a variable-time constant (FIG. 4) and in terms of the above-referenced variable-time constant (FIG. 5). The horizontal axis of each graph is a unit of time, shown linearly, corresponding to the distance from the edge of a pulse or spike as shown at signal 344 of FIG. 3B. The vertical axis of each graph shows the above-noted time constant (RC) in exponential units, with FIG. 5 showing time constant in terms of frequency ($1/(2RC \times (3.1456))$). As shown at the top of the plot in FIG. 5, with the switches closed, the corresponding resistors provide a minimal resistance to maximize the gain at point 0 along the horizontal axis (where the edge of the spike is sensed). It would be appreciated that the resistances and capacitance (for the RC) and timing can be adjusted as may be desired for the given application and clock timing, where the above-illustrated timing assumes an 8 MHz clock for the drive circuitry and related circuit timing and state machine timing with RF-noise filtering adjusted/optimized to lessen odd and even harmonics derived therefrom.

FIGS. 6A through 6G form parts of another time-based diagram showing examples of further signal timing relative to the stages of the circuitry illustrated in FIG. 2B. In FIG. 6A, the TX signal 610 is shown, with delineation of one cycle (or period), as it would appear on the drive electrodes of the previously-illustrated touch panels. After being passed along by the receive electrodes, the response signal is processed (differentiated) by a differentiator circuit (e.g., via the VGA circuit 282), to produce a differentiated form of the TX signal 610, as shown in FIG. 6B. With the exemplified TX signal 610 implemented as a square wave (a series of rectangle pulses), the differentiation operation produces impulse pulses including a negative-going impulse pulse (e.g., 620*a*) associated with each positive-going transition of the rectangle pulse and a positive-going impulse pulse (e.g., 620*b*) associated with each negative-going transition of the rectangle pulse. While the impulse pulses can become somewhat rounded due to the operational amplifier signal bandwidth and the RC filter effects of the touch screen, this derived form of the response signal is a differentiated representation of the drive signal.

FIGS. 6C and 6D show further processing of the response signal by the first and second stages of the sense unit (280 of FIG. 2B). FIG. 6C shows the gain aspect of the first stage as discussed above with FIGS. 4 and 5 (showing gain of the operational amplifier attributable to the first stage) and with the integration reset (in the feedback) centered between impulse pulses and with timing of the gain being adjusted/optimized by changing the RC time constant via the effective resistance as shown hereinabove (optionally, this change can also be implemented changing the effective capacitance). FIG. 6F shows a less-ideal characterization of the signal at the output of the first stage, with the gain being shown for the bi-polar (both positive and negative) aspects of the processed response signal. For certain implementations, this first stage might be deemed adequate as noise, including odd harmonics of the TX signal, between impulse pulses is significantly suppressed.

For other implementations, this first stage is complemented by the second stage (290 of FIG. 2B) which provides further noise filtering including suppression (nulling) of the even harmonics ensuing from the TX signal. Accordingly, the second stage further affects the response signal by performing an integrate-and-dump operation relative to the positive and negative transitions at the input of the second stage (as in FIGS. 6C and 6E). The dump aspect of the operation occurs at the low point of the signal shown in FIG. 6C, as controlled by a capacitance-shorting switch in the negative feedback loop of the operational amplifier 291 of FIG. 2B. The integration starts after each dump (or reset).

FIG. 6G illustrates the summing operation performed via the operational amplifier 291, whereby the positive and negative edge transitions are combined for maximum signal strength and, ideally, the noise between these positive and negative edge transitions cancel by the summing operation as in common-mode suppression.

Various modules and/or other circuit-based building blocks, as exemplified in the figures, may be implemented to carry out one or more of the operations and activities as described in connection with the figures. In such contexts, a "stage" of "module" is a circuit that carries out one or more of these or related operations/activities. For example, in certain of the above-discussed embodiments, one or more modules are discrete logic circuits or programmable logic circuits configured and arranged for implementing these operations/activities, as in the circuit modules shown in the Figures. In certain embodiments, the programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions.

Also, unless otherwise indicated, all numbers expressing quantities, measurement of properties, and so forth used in the specification and claims are to be understood as being modified by the term "about". Accordingly, unless indicated to the contrary, the numerical parameters set forth in the specification and claims are approximations that can vary depending on the desired properties sought to be obtained by those skilled in the art utilizing the teachings of the present application. Each numerical parameter should at least be construed in light of the number of reported significant digits and by applying ordinary rounding techniques.

Various modifications and alterations of this disclosure will be apparent to those skilled in the art without departing from the spirit and scope of this disclosure, and it should be understood that this disclosure is not limited to the illustrative embodiments set forth herein. For example, the reader should assume that features of one disclosed embodiment can also be applied to all other disclosed embodiments unless otherwise indicated.

The invention claimed is:

1. A touch-sensitive apparatus, comprising:
 a touch surface circuit including a touch surface and a plurality of electrodes, each of the plurality of electrodes being configured and arranged to be associated with a coupling capacitance that changes in response to a capacitance-altering touch at the touch surface;
 a sense circuit configured to generate response signals for the plurality of electrodes; each of the response signals having an amplitude responsive to the coupling capacitance at the touch surface and including a differentiated signal representation with transient portions characterizing positive-going transitions towards an upper signal level and negative-going transitions towards a lower signal level; and
 an amplification circuit configured and arranged to provide time-varying parameters for characterizing the transient portions, the amplification circuit including a variable-gain amplifier configured and arranged for processing the differentiated signal representation of the response signals to provide variable gain thereto, in response to the time-varying parameters, the gain being adjusted for the transient portions relative to gain for portions of the response signals between the transient portions, and therein suppressing harmonics in the response signals for providing a noise filtered output that characterizes the associated coupling capacitance for determining positions of touches on the touch surface.

2. The touch-sensitive apparatus of claim 1, wherein the variable-gain amplifier is further configured and arranged for processing the response signals to provide variable gain thereto by increasing gain for the transient portions and decreasing gain for portions of the response signals between the transient portions.

3. The touch-sensitive apparatus of claim 2, wherein the variable-gain amplifier is further configured and arranged to suppress harmonics, including the $3^{rd}$ and $5^{th}$ harmonics, in the response signals, to filter noise interference in the response signals as part of the processing by the variable-gain amplifier.

4. The touch-sensitive apparatus of claim 1, wherein the variable-gain amplifier includes an integration circuit that uses the time-varying parameters to provide an integration-and-dump filter operation at the transient portions with decimation to a multiple of a clock rate used for sampling the response signals, and further including a measurement circuit configured for responding to the response signals processed via the variable-gain amplifier by performing measurements on characterizations of the associated coupling capacitance and determining therefrom positions of touches on the touch surface.

5. The touch-sensitive apparatus of claim 1, wherein the variable-gain amplifier is further configured and arranged to perform an integration on the differentiated signal representation of the response signals using the time-varying parameters to facilitate decimation at the transient portions and creation of nulls in the frequency response of the integration for the $3^{rd}$ and $5^{th}$ harmonics of an RF signal in the differentiated signal representation.

6. The touch-sensitive apparatus of claim 1, wherein the plurality of electrodes includes drive electrodes and wherein the touch surface circuit further included a signal driver circuit configured and arranged for driving the drive electrodes with an RF signal for developing the response signal.

7. The touch-sensitive apparatus of claim 1, wherein the plurality of electrodes includes drive electrodes, wherein the touch surface circuit further includes a signal driver circuit configured and arranged for driving the drive electrodes with an RF signal for developing the response signal, and wherein the variable-gain amplifier is further configured and arranged to perform an integration on the differentiated signal representation of the response signals using the time-varying parameters to facilitate decimation at the transient portions and creation of nulls in a frequency response for the $3^{rd}$ and $5^{th}$ harmonics of the RF signal for filtering at the $3^{rd}$ and $5^{th}$ harmonics.

8. The touch-sensitive apparatus of claim 1, wherein the variable-gain amplifier is further configured and arranged to perform an integration on the differentiated signal representation of the response signals using the time-varying parameters to facilitate decimation at the transient portions and, in response thereto, facilitate suppression in the frequency response of the integration for both odd harmonics and of an RF signal in the differentiated signal representation.

9. The touch-sensitive apparatus of claim 1, wherein the variable-gain amplifier includes a first stage configured and arranged to perform an integration on the differentiated signal representation of the response signals using the time-varying parameters to facilitate decimation at the transient portions for creation of nulls for a set of odd and even harmonics of the RF signal, and a second stage, responsive to the first stage, configured and arranged to suppress in a frequency response of the integration for both odd and even harmonics of an RF signal in the differentiated signal representation, thereby filtering RF noise interference.

10. The touch-sensitive apparatus of claim 1, further including a measurement circuit configured for responding to the response signals processed via the variable-gain amplifier by performing measurements on characterizations of the associated coupling capacitance and determining therefrom positions of touches on the touch surface, wherein the variable-gain amplifier includes a first stage configured and arranged to perform an integration on the differentiated signal representation of the response signals using the time-varying parameters to facilitate decimation at the transient portions for creation of nulls for odd harmonics of the RF signal, and a second stage, responsive to the first stage, configured and arranged to suppress in a frequency response of the integration for both odd and even harmonics of an RF signal in the differentiated signal representation, thereby filtering RF noise interference.

11. The touch-sensitive apparatus of claim 10, wherein the first stage is configured and arranged to perform an integration on the differentiated signal representation of the response signals using the time-varying parameters to facilitate decimation at the transient portions and creation of nulls in the frequency response of the integration for the $3^{rd}$ and $5^{th}$ harmonics of an RF signal in the differentiated signal representation.

12. The touch-sensitive apparatus of claim 11, wherein the second stage is configured and arranged to perform an integration for combining the transient portions at the positive-going transitions and the negative-going transitions, for increasing signal strength.

13. The touch-sensitive apparatus of claim 1, wherein the plurality of electrodes includes drive and receive electrodes that are arranged to provide an electrode matrix in which each drive electrode is capacitively coupled to each receive electrode at a respective node of the matrix.

14. The touch-sensitive apparatus of claim 13, further including a drive unit configured to generate a drive signal and to deliver the drive signal to the drive electrodes, and wherein the sense unit is further configured to generate, for drive signals delivered to each drive electrode, response signals for the plurality of receive electrodes.

15. The touch-sensitive apparatus of claim 1, wherein the variable-gain amplifier and the measurement unit are further configured and arranged to reduce or eliminate common mode noise.

16. The touch-sensitive apparatus of claim 1, wherein the plurality of electrodes includes drive and receive electrodes that are arranged to provide an electrode matrix in which each drive electrode is capacitively coupled to each receive electrode at a respective node of the matrix, and further including
a drive unit configured and arranged to generate a drive signal and to deliver the drive signal to the drive electrodes, and wherein the sense unit is further configured to generate, for drive signals delivered to each drive electrode, response signals for the plurality of receive electrodes; and
a measurement circuit configured and arranged to measure an amplitude of each of the response signals for each of the nodes, and to determine therefrom the positions of multiple temporally-overlapping touches, if present, on the touch surface, wherein the measurement unit includes an analog-to-digital converter (ADC) and a multiplexer, the ADC coupling to the sense unit through the multiplexer.

17. The touch-sensitive apparatus of claim 1, further including a drive unit configured to generate pulsed drive signals and to deliver the pulsed drive signals to the drive electrodes, wherein the sense unit is further configured to generate, for the pulsed drive signals delivered to each drive electrode, response signals for the plurality of receive electrodes, wherein the plurality of electrodes includes drive and receive electrodes that are arranged to provide an electrode matrix in which each drive electrode is capacitively coupled to each receive electrode at a respective node of the matrix, and wherein the sense unit includes, for each of the receive electrodes, a reset switch coupled to the respective capacitor and configured to discharge the respective capacitor in response to a reset signal.

18. The apparatus of claim 1, wherein the drive signal includes a plurality of sequential pulses, each in the form of a ramped pulse or a rectangular pulse, and each response signal includes a corresponding plurality of response pulses, and wherein the measurement unit is configured to measure for each response signal an amplitude representative of amplitudes of the plurality of response pulses.

19. A touch-sensitive apparatus, comprising:
touch surface means, including a touch surface and a plurality of electrodes, each of the plurality of electrodes being configured and arranged to be associated with a coupling capacitance that changes in response to a capacitance-altering touch at the touch surface, and the touch surface means for providing the response;
sensing means configured to generate response signals for the plurality of electrodes; each of the response signals having an amplitude responsive to the coupling capacitance at the touch surface and including a differentiated signal representation with transient portions characterizing positive-going transitions towards an upper signal level and negative-going transitions towards a lower signal level; and
means for using time-varying parameters to process the response signals to provide variable gain thereto by adjusting gain for the transient portions relative to gain for portions of the response signals between the transient portions, and therein suppressing harmonics in the response signals; and thereby facilitating measurement of the response signals to determine therefrom positions of touches on the touch surface in response to changes of the coupling capacitance.

20. A method for use of a touch surface circuit including a touch surface and a plurality of electrodes, each of the plurality of electrodes being configured and arranged to be associated with a coupling capacitance that changes in response to a capacitance-altering touch at the touch surface, the method comprising:
using a circuit to generate response signals for the plurality of electrodes, wherein each of the response signals has an amplitude responsive to the coupling capacitance at the touch surface and includes a differentiated signal representation with transient portions characterizing positive-going transitions towards an upper signal level and negative-going transitions towards a lower signal level;
operating another circuit that
uses time-varying parameters for processing the response signals to provide variable gain thereto by adjusting gain for the transient portions relative to gain for portions of the response signals between the transient portions, and therein suppressing harmonics in the response signals, and
measures the response signals and for determining therefrom positions of touches on the touch surface in response to changes of the coupling capacitance.

* * * * *